United States Patent [19]

Heeks

[11] 4,006,436
[45] Feb. 1, 1977

[54] SURFACE ACOUSTIC WAVE DELAY LINES

[75] Inventor: John Stuart Heeks, Harlow, England

[73] Assignee: International Standard Electric Corporation, New York, N.Y.

[22] Filed: Mar. 26, 1976

[21] Appl. No.: 670,926

[30] Foreign Application Priority Data

May 20, 1975 United Kingdom ............. 21462/75

[52] U.S. Cl. ............................... 333/30 R; 310/8.1; 310/9.8; 333/72

[51] Int. Cl.$^2$ ..................... H03H 9/26; H03H 9/30; H03H 9/32; H01L 41/10

[58] Field of Search ............... 333/30 R, 72; 310/8, 310/8.1, 8.2, 9.4, 9.7, 9.8; 340/173 RC, 173.2

[56] References Cited

UNITED STATES PATENTS

| | | |
|---|---|---|
| 3,831,116 | 8/1974 | Davis, Jr. et al. ..................... 333/72 |
| 3,878,407 | 4/1975 | Hartemann et al. ......... 333/30 R X |
| 3,898,592 | 8/1975 | Solie .................................... 333/72 |

FOREIGN PATENTS OR APPLICATIONS 1,197,860  7/1970  United Kingdom ............. 333/30 R Primary Examiner—Alfred E. Smith
Assistant Examiner—Marvin Nussbaum
Attorney, Agent, or Firm—John T. O'Halloran; Peter C. Van Der Sluys; Vincent Ingrassia

[57] ABSTRACT

A surface acoustic wave delay line uses a closed loop principle with separate input and output transducers side by side. 3dB Multistrip couplers are introduced to achieve substantially 100% transfer for surface acoustic wave energy from the propagation path associated with the input transducer to the propagation path associated with the output transducer. Several such delay lines can be formed on a single cylindrical body of piezoelectric material and these can then be cascaded with intermediate amplification to form a long delay or a tapped delay.

12 Claims, 3 Drawing Figures

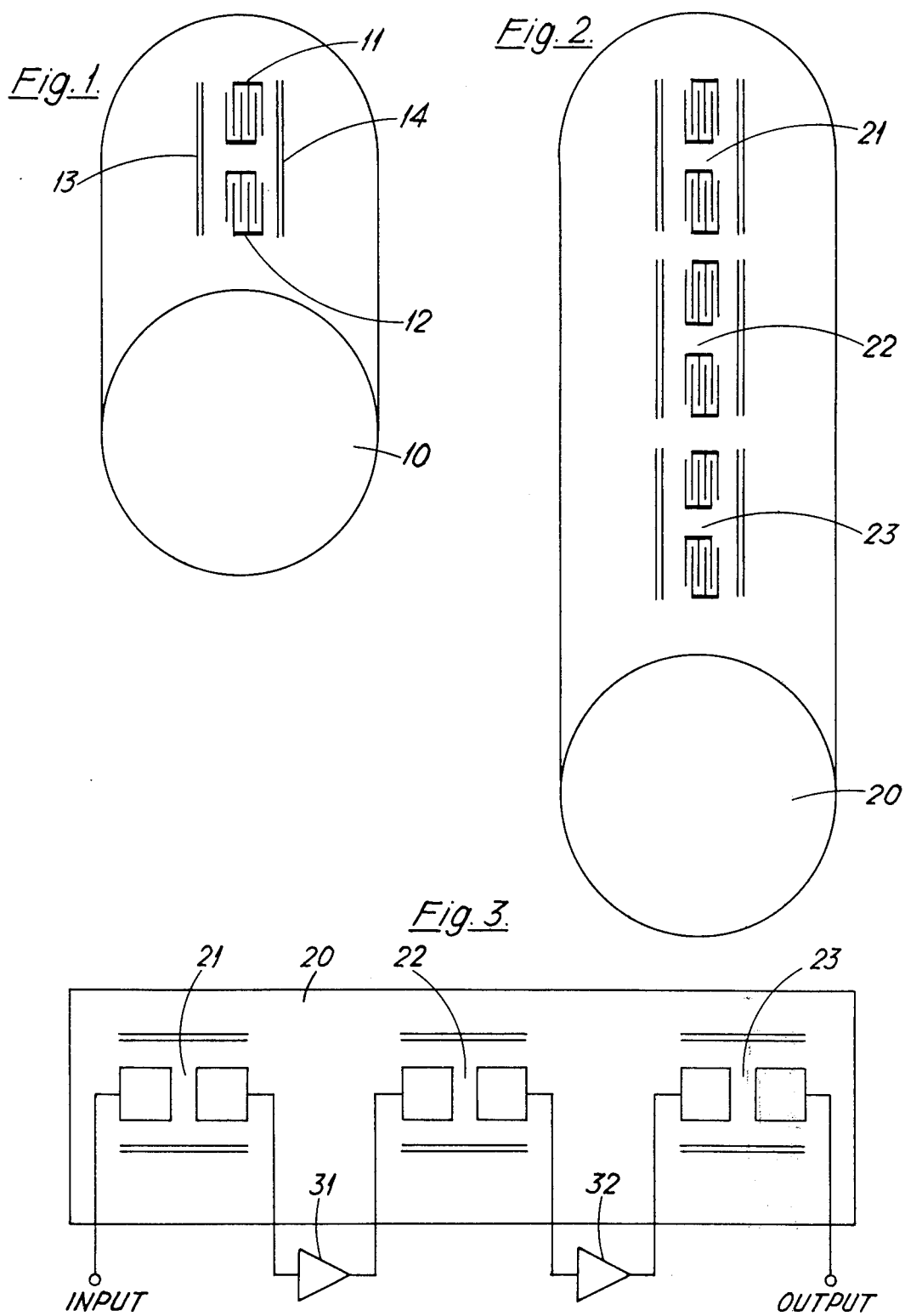

SURFACE ACOUSTIC WAVE DELAY LINES

BACKGROUND OF THE INVENTION

This invention relates to surface acoustic wave delay lines.

The propagation of surface acoustic waves between input and output transducers located on the same surface of a body of piezoelectric material is known and has been utilized to fabricate, inter alia, delay lines for radio frequency signals. A common form of delay line is one in which the acoustic waves are propagated in straight lines between transducers located on a flat surface. It is apparent that the maximum delay of such a line is a function of the available length of the flat surface.

In British Pat. No. 1,197,860 there is disclosed a delay line having a single input/output transducer positioned on an annular surface whereby bidirectional acoustic waves launched by the transducer travel around the annular surface and are recovered, in phase, at the transducer to provide the output signal. Typically, the annular propagation path may be on the surface of a cylinder or piezoelectric material.

SUMMARY OF THE INVENTION

It is an object of the present invention to provide a surface acoustic wave delay line with separate input and output transducers arranged side by side.

According to the present invention there is provided a surface acoustic wave delay line including a cylindrical body of piezoelectric material having on the cylinder surface a pair of separate input and output transducers arranged adjacent one another on a straight line which is parallel to the cylindrical axis, the transducers being so oriented that the propagation paths associated therewith are normal to the straight line, and two directional coupler devices each having a predetermined coupling coefficient located on either side of the pair of transducers so as to provide mutual coupling between acoustic waves in both propagation paths associated with the transducers.

In a modification of the invention a surface acoustic wave delay line includes a cylindrical body of piezoelectric material having on the cylindrical surface a plurality of pairs of separate input and output transducers, the transducers of each pair being arranged adjacent one another on a straight line, the line being parallel to the cylindrical axis, the transducers of each pair being so oriented that the propagation paths associated therewith are normal to the straight line, and associated with each pair of transducers two directional coupler devices each having a 3dB coupling coefficient, the couplers being located on either side of the pair of transducers so as to provide mutual coupling between acoustic waves in both propagation paths associated with the pair of transducers.

This modification of the invention lends itself to the construction of long delay lines since the modification can be utilized as a number of individual delays which can be cascaded. Similarly it lends itself to the construction of a tapped delay line. In both cases it is possible to introduce amplification between the stages.

The above and other objects of the present invention will be more clearly understood from the following detailed description taken in conjunction with the accompanying drawings, in which:

BRIEF DESCRIPTION OF THE DRAWINGS

FIG. 1 illustrates a single stage delay line according to the invention;

FIG. 2 illustrates a plurality of delay stages formed on a single piezoelectric body according to the invention; and FIG. 3 illustrates the contraction of a multiple stage delay line using the structure illustrated in FIG. 2.

DESCRIPTION OF THE PREFERRED EMBODIMENT

The delay line shown in FIG. 1 consists of a cylindrical body 10 of piezoelectric material on the cylindrical surface of which are formed two electro-acoustic transducers 11, 12, and two multistrip directional couplers 13, 14. The transducers 11, 12, may be of the interdigital type such as is described in "Rayleigh and Lamb Waves — Physical Theory and Applications" by I. A. Viktorov, published by Plenum Press, New York, 1967, at pages 8 and 9. Two sets of interdigital contact strips are connected to separate terminals (not shown). When an electrical radio frequency signal is applied to the transducer acoustic waves are launched in opposite directions, normal to the axes of the contact strips, in the surface region of the piezoelectric material. Thus surface acoustic waves may be launched in opposite directions by transducer 11. These surface acoustic waves encounter the multistrip couplers 13, 14, which may be of the type described in "Novel Acoustic Surface Wave Directional Coupler" by Marshall and Page, Electronics Letters, August 1971, pp 460. A feature of such couplers is that the coupling efficiency is a function of the number of contact strips in the coupler. Thus it is possible to fabricate couplers having a 50% power split, referred to as 3dB couplers. Each of the acoustic waves launched by transducer 11, will therefore be divided into two equal portions, 90° out of phase with one another, one portion continuing on the original propagation path normally associated with the transducer 11 and the other portion proceeding on the propagation path normally associated with transducer 12. These two portions will propagate round the cylindrical surface of the body 10 until they arrive at the other coupler where, because of the nature of the coupler, they will combine to recreate the complete original acoustic wave, only now the acoustic wave will be transferred wholly to the propagation path associated with transducer 12. This is true in both directions of propagation from transducer 11, so that transducer 12 will receive two acoustic waves from opposite directions, in phase with one another but 180° out of phase with the waves launched by transducer 11. These waves received by transducer 12 will combine to form an electrical radio frequency output from transducer 12.

In the arrangement shown in FIG. 2 several individual delay lines 21, 22, 23, each similar to the delay line of FIG. 1, are formed on a single body 20 of piezoelectric material. These individual delay lines can be cascaded as shown in FIG. 3. The input signal is applied to delay line 21, the output of which is coupled to the input of delay line 22, via an amplifier 31, if necessary. The output of delay line 22 is coupled to the input of delay line 23 via an amplifier 32. The total delay obtainable by this arrangement depends on the circumference of the piezoelectric body 20 and the number of individual delay lines which can be accommodated along its length.

The arrangement of FIGS. 2 and 3 can also be utilized for a tapped delay line, the signal being tapped between successive individual delay lines.

While the embodiments illustrated show the use of circular cross-section piezoelectric bodies the delay lines can equally well be formed on cylindrical bodies having an oval or elliptical cross-section.

It is to be understood that the foregoing description of specific examples of this invention is made by way of example only and is not to be considered as a limitation on its scope.

What is claimed is:

1. A surface acoustic wave delay line comprising;
   a cylindrical body of piezoelectric material;
   a pair of separate input and output transducers arranged on the surface of said cylindrical body and adjacent one another on a straight line parallel to the cylindrical axis, said transducers being so oriented that the propagation paths associated therewith are normal to said straight line; and
   two directional coupler devices each having a predetermined coupling coefficient located on either side of said pair of transducers so as to provide mutual coupling between acoustic waves in both propagation paths associated with said transducers.

2. A surface acoustic wave delay line according to claim 1 wherein said input and output transducers each comprise two sets of parallel interdigital contact strips formed on the surface of said body, each set being connected to a separate terminal, said strips being parallel to a longitudinal axis of said body.

3. A surface acoustic wave delay line according to claim 2 wherein said cylindrical body has a circular cross-section.

4. A surface acoustic wave delay line according to claim 2 wherein said cylindrical body has an oval cross-section.

5. A surface acoustic wave delay line according to claim 2 wherein said cylindrical body has an elliptical cross-section.

6. A surface acoustic wave delay line according to claim 2 wherein said directional coupler devices each have a 3 dB coupling coefficient.

7. A surface acoustic wave delay line comprising:
   a cylindrical body of piezoelectric material;
   a plurality of pairs of separate input and output transducers arranged on the surface of said cylindrical body, the transducers of each pair being adjacent one another on a straight line parallel to the cylindrical axis and so oriented that the propagation paths associated therewith are normal to said straight line; and
   a pair of directional coupler devices having a predetermined coupling coefficient associated with each pair of transducers, the couplers being located on either side of said pair of transducers so as to provide mutual coupling between acoustic waves in both propagation paths associated with the pair of transducers.

8. A surface acoustic wave delay line according to claim 7 wherein said input and output transducers each comprise two sets of parallel interdigital contact strips formed on said body, each set being connected to a separate terminal and the strips being parallel to a longitudinal axis of said body.

9. A surface acoustic wave delay line according to claim 8 wherein said directional coupler devices each comprise a plurality of parallel contact strips formed on said body, said strips of each coupler device extending in length to traverse the propagation paths associated with one pair of input and output transducers.

10. A surface acoustic wave delay line according to claim 9 wherein said cylindrical body has a circular cross-section.

11. A surface acoustic wave delay line according to claim 9 wherein said cylindrical body has an oval cross-section.

12. A surface acoustic wave delay line according to claim 9 wherein said cylindrical body has an elliptical cross-section.

* * * * *